United States Patent [19]

Takada et al.

[11] 4,350,563

[45] Sep. 21, 1982

[54] DRY ETCHING OF METAL FILM

[75] Inventors: Tadakazu Takada, Kawasaki; Kazuo Tokitomo, Aizuwakamatsu; Hitoshi Hoshino, Yokohama, all of Japan

[73] Assignee: Fujitsu Limited, Kawasaki, Japan

[21] Appl. No.: 174,140

[22] Filed: Jul. 31, 1980

[30] Foreign Application Priority Data

Jul. 31, 1979 [JP] Japan .................................. 54/98201
Jul. 31, 1979 [JP] Japan .................................. 54/98202
Jul. 31, 1979 [JP] Japan .................................. 54/98203

[51] Int. Cl.$^3$ .............................................. C23F 1/02
[52] U.S. Cl. .................................... 156/643; 156/646; 156/652; 156/656; 156/659.1; 156/665; 156/667; 204/192 E; 252/79.1
[58] Field of Search ............... 152/643, 646, 652, 653, 152/656, 665, 659.1, 667; 252/79.1; 204/164, 192 E, 298; 427/38, 39, 88

[56] References Cited

U.S. PATENT DOCUMENTS 3,971,684 7/1976 Muto ............................... 252/79.1 X
3,994,793 11/1976 Harvilchuck et al. ........... 204/192 E
4,030,967 6/1977 Ingrey et al. ....................... 156/643

OTHER PUBLICATIONS

Technical Digest 1976, International Electron Devices Meeting, Dec. 6, 7, and 8, 1976, Washington D.C., Plasm Etching of Aluminum by Poulsen et al., pp. 205-208.
J. Vac. Sci. Technol. 15(2) Mar./Apr. 1978, Reactive Ion Etching of Aluminum and Aluminum Alloys in an rf Plasma Containing Halogen Species by P. M. Schaible et al., pp. 334-337.

Primary Examiner—William A. Powell

[57] ABSTRACT

A process for dry etching an aluminum film or an aluminum based film in the production of a semiconductor device, wherein a mixed gas of carbon chloride and boron chloride is used as the etchant gas.

12 Claims, 19 Drawing Figures

TOTAL PRESSURE ($\bar{P}$) 200 milli-Torr
(P) $CCl_4$/($\bar{P}$) = 0.5
(P) $PCl_3$/($\bar{P}$) = 0.5

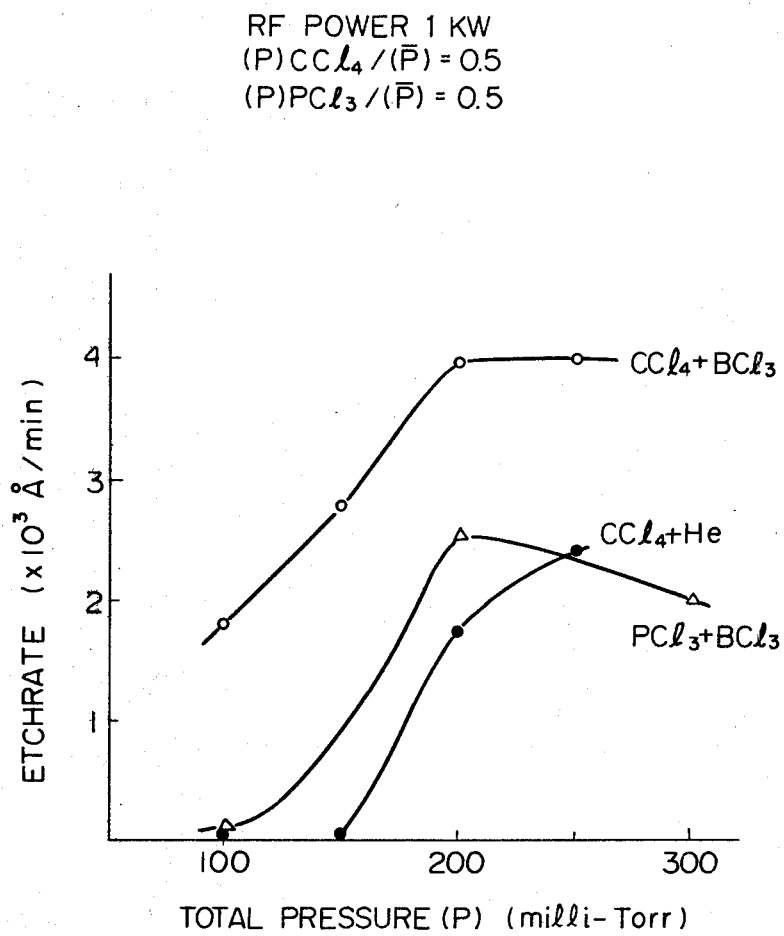

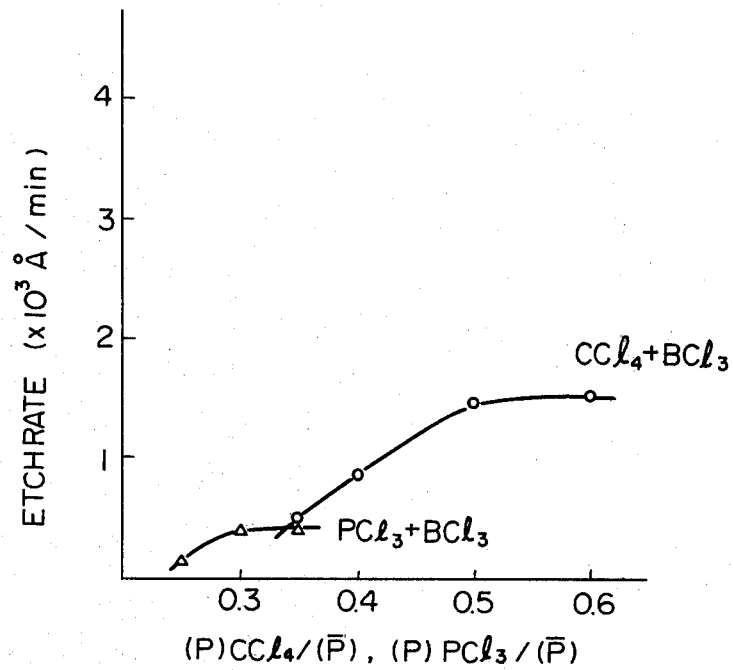

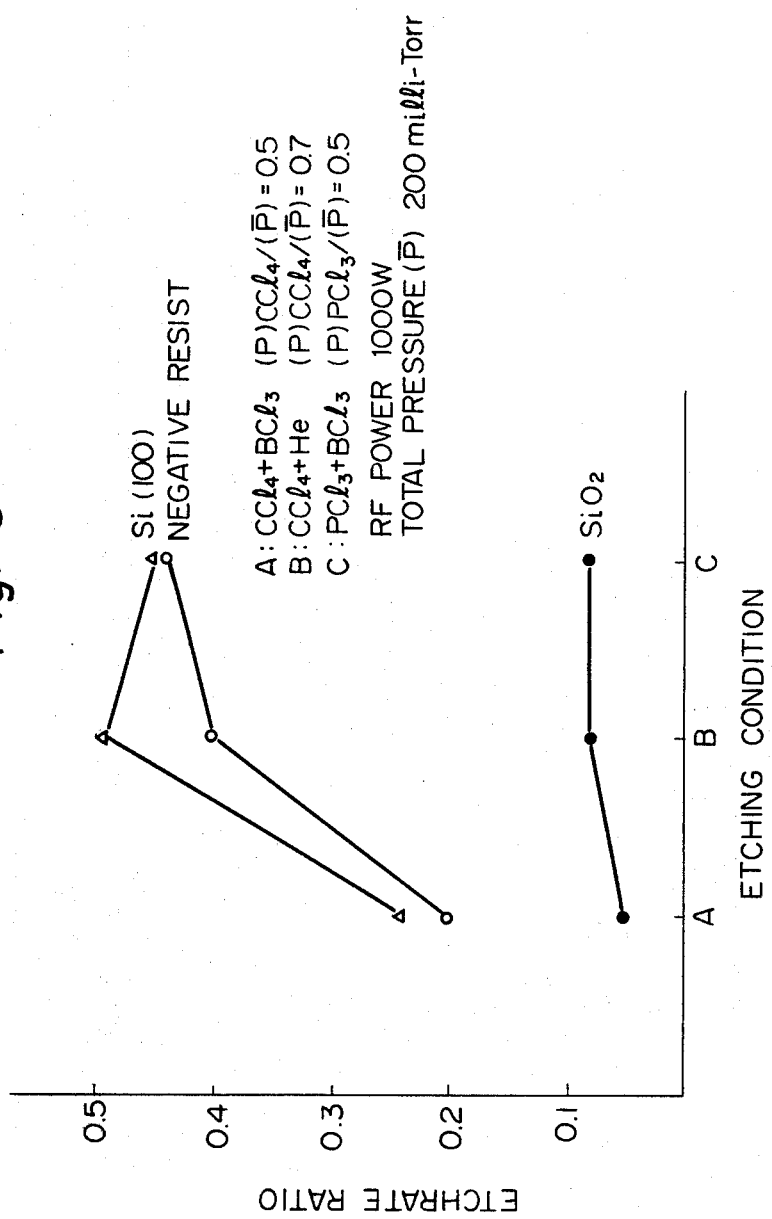

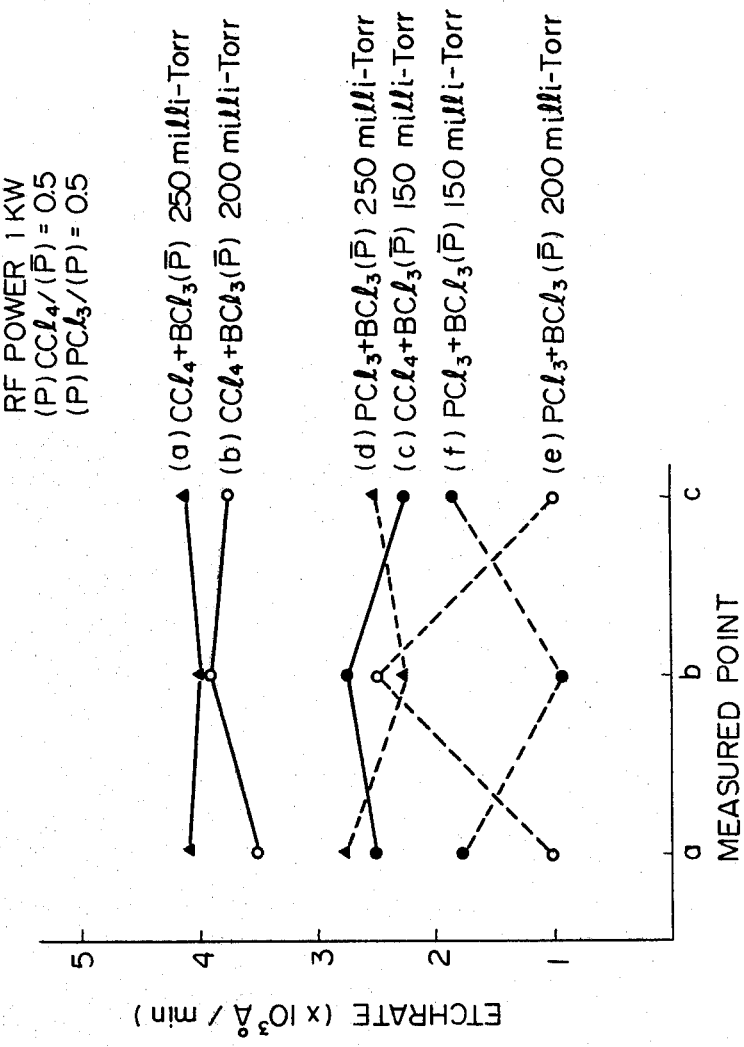

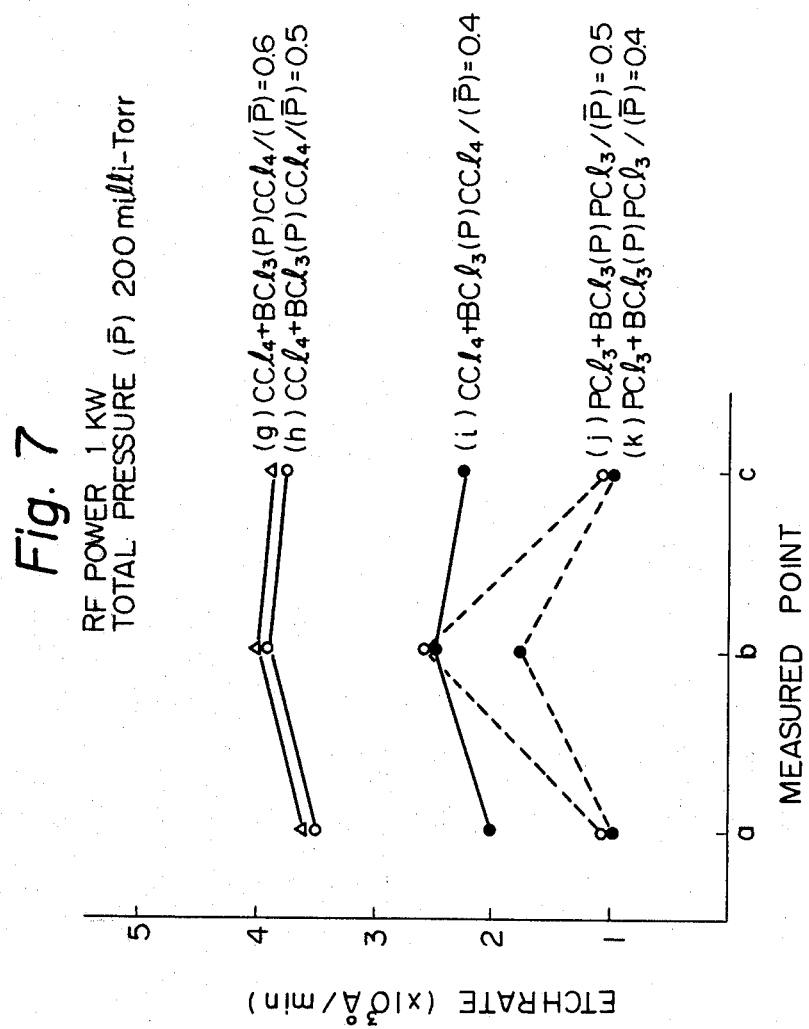

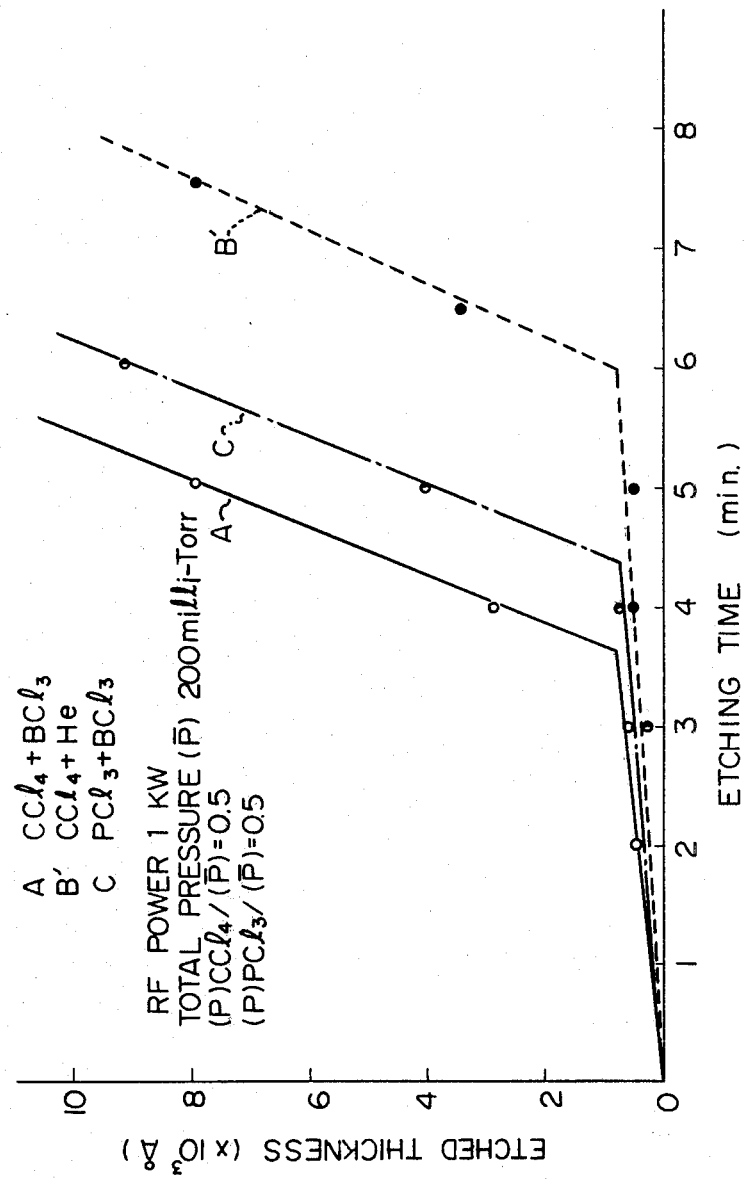

DRY ETCHING OF METAL FILM

BACKGROUND OF THE INVENTION

1. Field of the Invention

The present invention relates to dry etching, more particularly to a process for the dry etching of a metal film which comprises aluminum as a main component and is provided on a semiconductor chip.

It is preferable to apply the present invention to formation of a conductor pattern from an aluminum film or an aluminum based film in the production of semiconductor devices.

2. Description of the Prior Art

Materials of a conductor pattern of a semiconductor device are generally aluminum or aluminum based metal, such as aluminum-copper, aluminum-silicon or aluminum-copper-silicon. The addition of copper to aluminum increases its electromigration resistance, and the addition of silicon to aluminum prevents silicon depletion of shallow junctions.

In a case where a conductor pattern of a semiconductor device is formed by etching an aluminum film or an aluminum based film, dry etching, i.e. plasma etching, reactive ion etching, or reactive sputter etching, is preferred to wet chemical etching for several reasons. For example, dry etching is cleaner, results in a smaller linewidth of the pattern (i.e. film pattern), there are no noxious and polluting acids and solvents involved, and it is more economical than wet etching. Several etchant gases, for example, the following three kinds of gases, have been proposed for the dry etching of an aluminum film and an aluminum based film.

(1) Mixed gas of carbon tetrachloride ($CCl_4$) and inert gas (He, Ar)

When dry etching of an aluminum film using this mixed gas is finished, a so-called "aluminum residue", which is aluminum oxide, tends to remain.

When an aluminum-copper film is dry etched with this mixed gas, the aluminum of the film is converted into aluminum trichloride ($AlCl_3$), which is volatile at approximately 130° C., and therefore, aluminum removal occurs. However, the copper compound of the film is volatile only at temperatures above 1000° C. and, since the temperature does not exceed 150° C. during the etching period, volatilizing of the copper compound does not occur. As a result, since copper residues accumulate during the dry etching and prevent further etching, it is difficult to etch an aluminum-copper film.

(2) Mixed gas of phosphorus trichloride ($PCl_3$) and boron trichloride ($BCl_3$)

This mixed gas ($PCl_3 + BCl_3$) has the ability to cause chemical sputtering of a metal film to be etched and, therefore, it is possible to etch an aluminum film and an aluminum-copper film, and simultaneously, to remove aluminum residues and copper residues. However, phosphorus trichloride has strong corrosive tendencies, easily reacts with moisture in the air to produce hydrochloric acid (HCl), and is labile. Furthermore, the permissible concentration range of the phosphorus trichloride is very narrow and depends on the dry etching conditions, such as the pressure inside the vaccum system, the power of the etching apparatus and the total pressure of the mixed gas. If the concentration of the phosphorus trichloride is outside the permissible range, satisfactory etching can not be performed. In addition, when an aluminum film or an aluminum based film is dry etched using this mixed gas, the mixed gas tends to undercut a masking film (i.e. a patterned photoresist film), namely, the etchant gas horizontally etches a portion of the aluminum or aluminum based film which is covered with the masking film.

(3) Boron trichloride ($BCl_3$) with or without oxygen ($O_2$)

When an aluminum film is etched using boron trichloride only, the aluminum etchrate (i.e. etching rate) is small, since the number of generated chloric radicals is small. The addition of oxygen to the boron trichloride increases the number of the generated chloric radicals, so that the aluminum etchrate increases, but undesirable undercutting occurs.

As mentioned above, each of these etchant gases has demerits.

Furthermore, a person having an ordinary skill in the art might consider using fluorine gas, being one of halogen gases, as the etchant gas. However, on an aluminum film to be etched, an aluminum fluoride film is gradually formed since the aluminum fluoride is not volatile at temperatures under 1260° C. The aluminum fluoride film serves as an inert film, so that further etching progress is not made.

SUMMARY OF THE INVENTION

An object of the present invention is to provide a dry etching process wherein a new etchant gas for etching an aluminum film and an aluminum based film is used.

Another object of the present invention is to provide a process for dry etching an aluminum film and an aluminum based film at relatively high etchrates.

A further object of the present invention is to form a fine conductor pattern of aluminum or aluminum based metal on a semiconductor chip.

In accordance with the present invention, the above-mentioned objects are attained by a process for dry etching a metal film having aluminum as a main component, which comprises the step of exposing the metal film to an etchant gas having as a principal ingredient a mixed gas of carbon chloride (e.g. carbon tetrachloride) and boron chloride (e.g. boron trichloride). It is preferable that the partial pressure of the carbon tetrachloride be in the range of from 30 to 80 percent of the total pressure of the mixed gas, and that the etchant gas have a pressure in the range of from 100 to 250 milli-Torr.

BRIEF DESCRIPTION OF THE DRAWINGS

The above-mentioned and other objects and advantages of the present invention will become more apparent from the detailed description of preferred embodiments, set forth below, with reference to the accompanying drawings, wherein:

FIG. 3 is a diagram showing the relationship between the aluminum etchrate and total pressure of etchant gas with regard to the three kinds of etchant gases;

FIG. 4 is a diagram showing the relationship between the aluminum-copper etchrate and partial pressure ratio of $CCl_4$ or $PCl_3$, with regard to two kinds of etchant gases;

FIG. 5 is a diagram showing the difference between etchrates of various materials;

FIG. 6 is a diagram showing the relationship between the aluminum etchrate nonuniformity and total pressure of etchant gas;

FIG. 7 is a diagram showing the relationship between the aluminum etchrate nonuniformity and partial pressure of etchant gas;

FIG. 8 is a diagram showing the relationship between the etched thickness of a specimen and etching time;

DETAILED DESCRIPTION OF THE REFERRED EMBODIMENTS

In order to compare the dry etching process of the present invention with dry etching process of the prior art, the following Experiments 1 through 9 were performed.

EXPERIMENT 1

Figure 1:
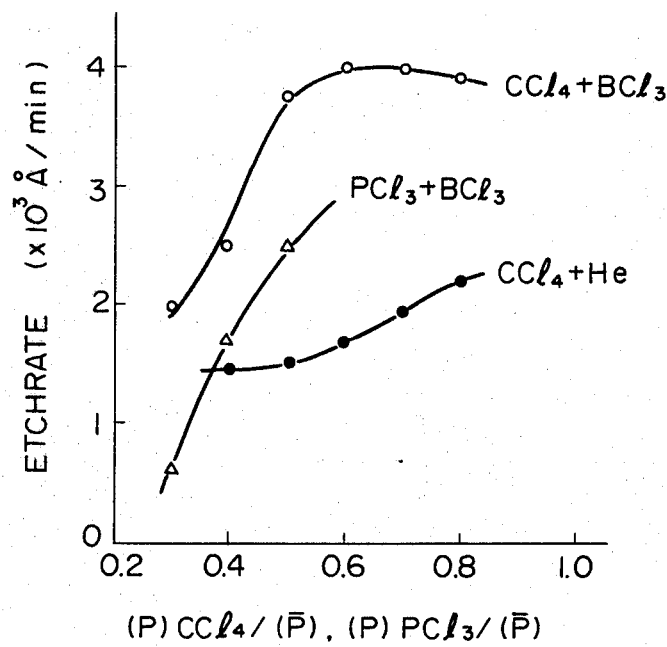
FIG. 1 is a diagram showing the relationship between the aluminum etchrate and partial pressure ratio of $CCl_4$ or $PCl_3$ with regard to three kinds of etchant gases.

High purity aluminum was etched in a conventional plasma etching apparatus under the following conditions, wherein the mixing ratio of each etchant gas was varied.
Etchant gas:
 $CCl_4 + BCl_3$, $PCl_3 + BCl_3$ or $CCl_4 + He$
Total pressure of etchant gas:
 200 milli-Torr
RF power (Frequency of RF power being 13.56 MHz):
 1 KW The results of the Experiment 1 are shown in FIG. 1, wherein the ordinate indicates the aluminum etchrate, and the abscissa indicates the ratio of partial pressure of $CCl_4$ or $PCl_3$ to the total pressure (200 milli-Torr) of the etchant gas. As is evident from FIG. 1, the aluminum etchant gas. As is evident from FIG. 1, the aluminum etchrate obtained by using the etchant gas (mixed gas) of $CCl_4$ and $BCl_3$ was higher than that obtained by using the mixed gas of $PCl_3$ and $BCl_3$ or the mixed gas of $CCl_4$ and He.

Experiment 2

Figure 2:
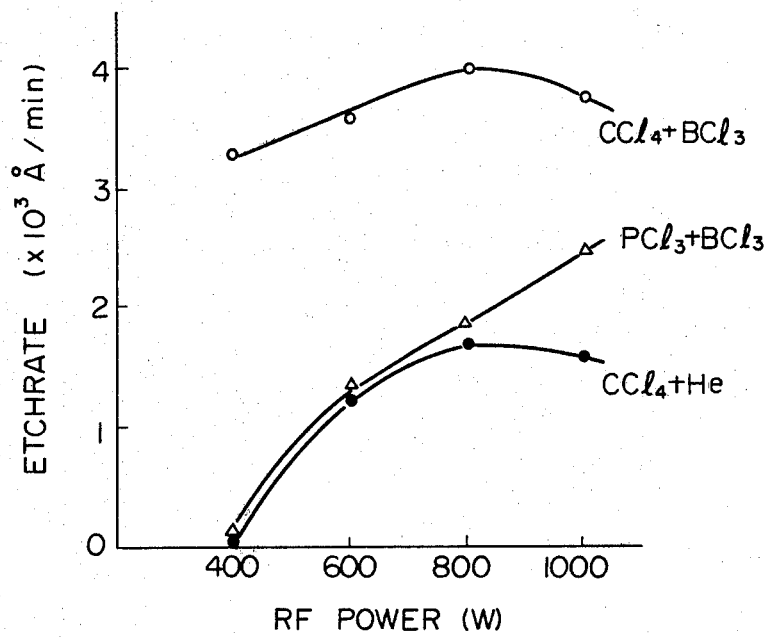
FIG. 2 is a diagram showing the relationship between the aluminum etchrate and RF power with regard to the three kinds of etchant gases.

High purity aluminum was etched in the plasma etching apparatus used in the Experiment 1 under the following conditions, wherein the RF power was varied.
Etchant gas:
 $CCl_4 + BCl_3$, $PCl_3 + BCl_3$ or $CCl_4 + He$
Total pressure of etchant gas:
 200 milli-Torr
Ratio of the partial pressure of $CCl_4$ or $PCl_3$ to the total pressure:
 0.5
RF power:
 400, 600, 800, and 1000 watts The results of the Experiment 2 are shown in FIG. 2. As is evident from FIG. 2, the aluminum etchrate obtained by using the mixed gas of $CCl_4$ and $BCl_3$ was higher than that obtained by using the mixed gas of $PCl_3$ and $BCl_3$ or the mixed gas of $CCl_4$ and He.

Experiment 3

High purity aluminum was etched in the plasma etching apparatus used in the Experiment 1 under the following conditions, wherein the total pressure of each etchant gas was varied.
Etchant gas:
 $CCl_4 + BCl_3$, $PCl_3 + BCl_3$ or $CCl_4 + He$
Total pressure of etchant gas:
 100, 150, 200, 250 and 300 milli-Torr
Ratio of the partial pressure of $CCl_4$ or $PCl_3$ to the total pressure:
 0.5
RF power:
 1 KW The results of the Experiment 3 are shown in FIG. 3. As is evident from FIG. 3, the aluminum etchrate obtained by using the mixed gas of $CCl_4$ and $BCl_3$ was higher than that obtained by using the mixed gas of $PCl_3$ and $BCl_3$ or the mixed gas of $CCl_4$ and He.

Experiment 4

Aluminum-copper (4 wt.%) metal was etched in the plasma etching apparatus used in the Experiment 1 under the following conditions, wherein the mixing ratio of each etchant gas was varied.
Etchant gas:
 $CCl_4 + BCl_3$ or $PCl_3 + BCl_3$
Total pressure of etchant gas:
 200 milli-Torr
RF power:
 1 KW The results of the Experiment 4 are shown in FIG. 4. The aluminum-copper metal etchrate obtained by using the etchant gas of $CCl_4$ and $BCl_3$ was higher than that obtained by using the etchant gas of $PCl_3$ and $BCl_3$.

Experiment 5

In order to compare etchrates of silicon (Si), of a negative type photoresist, of silicon dioxide ($SiO_2$), and of aluminum, a silicon wafer, a negative type photoresist film, a silicon dioxide film and an aluminum film were etched in the plasma etching apparatus used in the Experiment 1 under the following three conditions.

*Etching Condition A (the present invention)
Etchant gas:
 $CCl_4 + BCl_3$
Total pressure of the etchant gas:
 200 milli-Torr
Ratio of the partial pressure of $CCl_4$ to the total pressure:
 0.5
RF power:
 1 KW

*Etching condition B (a comparative example)
Etchant gas:
 $CCl_4 + He$
Total pressure of the etchant gas:

200 milli-Torr
Ratio of the partial pressure of $CCl_4$ to the total pressure:
0.7
RF power:
1 KW

*Etching condition C (another comparative example)
Etchant gas:
$PCl_3BCl_3$
Total pressure of the etchant gas:
200 milli-Torr
Ratio of the partial pressure of $PCl_3$ to the total pressure:
0.5
RF power:
1 KW In this experiment the silicon was a (100) oriented single crystalline silicon, the negative type photoresist was OMR-83 (a product of TOKYO OHKA KOGYO) and the silicon dioxide was produced by thermal oxidation of silicon.

The results of the Experiment 5 are shown in FIG. 5, wherein the ordinate indicates the ratio of each of the etchrates of the silicon, photoresist and silicon dioxide to the aluminum etchrate the Experiment 1. As is evident from FIG. 5, the etchrates of the silicon and photoresist obtained under the etching condition A were lower than those obtained in both the etching conditions B and C. Namely, the selective etching ability of the etchant gas of $CCl_4$ and $BCl_3$ under the etching condition A is superior to that of the etchant gases under the etching conditions B and C.

Experiment 6

In order to investigate the relationship between aluminum etchrate nonuniformities across aluminum films and the total pressures of etchant gases, a high purity aluminum film formed on a silicon wafer, having a diameter of 3 inches (7.5 cm), was etched in the same plasma etching apparatus under the six conditions in Table 1.

TABLE 1

| | Etchant Gas | Etching Conditions Total Pressure of Etchant Gas (P) (milli-Torr) | Symbol in FIG. 6 |
|---|---|---|---|
| a | $CCl_4 + BCl_3$ | 250 | Triangle and Solid Line |
| b | $CCl_4 + BCl_3$ | 200 | White Circle and Solid Line |
| c | $CCl_4 + BCl_3$ | 150 | Black Circle and Solid Line |
| d | $PCl_3 + BCl_3$ | 250 | Triangle and Broken Line |
| e | $PCl_3 + BCl_3$ | 200 | White Circle and Broken Line |
| f | $PCl_3 + BCl_3$ | 150 | Black Circle and Broken Line |

Common factors of the etching conditions were that the RF power was 1 KW and the ratio of partial pressuer of $CCl_4$ or $PCl_3$ to the total pressure of each of the etchant gases was 0.5.

The aluminum etchrate was measured at three points a, b and c of the aluminum film, having a diameter of 3 inches, after the dry etching. The point b was the center of the aluminum film, and the points a and c were at a distance of approximetly 2.9 mm from the center point b, while the points a, b and c were in a straigh line.

The results of the Experiment 6 are shown in FIG. 6. As is evident from FIG. 6, the aluminum etchrate nonuniformities obtained by using the etchant gas of $CCl_4$ and $BCl_3$ were smaller than those obtained by using the etchant gas of $BCl_3$ and $BCl_3$.

Experiment 7

In order to investigate the relationship between aluminum etchrate nonuniformities accross aluminum films and the partial pressure of $CCl_4$ or $PCl_3$ of etchant gases, a high purity aluminum film which was the same as that in the Experiment 6 was etched in the plasma etching apparatus used in the Experiment 1 under the five conditions in Table 2.

TABLE 2

| | Etchant Gas | Etching Conditions Ratio of Partial Pressure of $CCl_4$ or $PCl_3$ to Total Pressure | Symbol in FIG. 7 |
|---|---|---|---|
| g | $CCl_4 + BCl_3$ | 0.6 | Triangle and Solid Line |
| h | $CCl_4 + BCl_3$ | 0.5 | White Circle and Solid Line |
| i | $CCl_4 + BCl_3$ | 0.4 | Black Circle and Solid Line |
| j | $PCl_3 + BCl_3$ | 0.5 | White Circle and Broken Line |
| h | $PCl_3 + BCl_3$ | 0.4 | Black Circle and Broken Line |

Common factors of the etching conditions were that the RF power was 1 KW and the total pressure of each of the etchant gases was 200 milli-Torr.

The aluminum etchrate was measured at the three points a, b and c of the aluminum film, which were the same points as explained above with regard to Experiment 6.

The results of the Experiment 7 are shown in FIG. 7. As is evident from FIG. 7, the aluminum etchrate nonuniformities obtained by using the etchant gas of $CCl_4$ and $BCl_3$ were smaller than those obtained by using the etchant gas of $PCl_3$ and $BCl_3$.

Experiment 8

The structure of specimens to be etched consisted of a silicon single crystalline wafer, a silicon dioxide ($SiO_2$) film having a thickness of 4000 angstroms (A), a high purity aluminum film having a thickness of 10,000 angstroms and an aluminum oxide (AlO$_x$, wherein x was in the range of 1 through 2) film having a thickness of 900 angstroms. The silicon dioxide film was formed by thermal oxidizing the surface of the silicon wafer and the aluminum film was formed on the silicon dioxide film by vacuum evaporation. Then, the aluminum film was oxidized by anodic oxidation to form the aluminum oxide film comprised of $Al_2O_3$. The specimens having the above-mentioned structure were etched in the plasma etching apparatus used in Experiment 1 under the three conditions A, B' and C as follows.

The Etching Conditions A and C were the same as the Etching Conditions A and C in Experiment 5, respectively. The etching condition B' was the same as the Etching Condition B in the Experiment 5, except that the partial pressure ratio of $CCl_4$ was 0.5.

The results of the Experiment 8 are shown in FIG. 8. As is evident from FIG. 8, the aluminum oxide layer can be etched most rapidly in the etching condition A, of the three etching conditions. Namely, the etchant gas of $CCl_4$ and $BCl_3$ can etch more rapidly than either the etchant gas of $PCl_3$ and $BCl_3$ or the etchant gas of $CCl_4$ and He.

Experiment 9

In order to investigate the amount of undercutting of a metal film to be etched under various conditions, samples to be etched were produced in the following manner. The same type of silicon single crystalline wafer as used in the Experiment 8 was thermally oxidized to form a silicon dioxide ($SiO_2$) film having a thickness of 4000 angstroms. On the silicon dioxide film a metal film of aluminum or aluminum-4 wt% copper, having a thickness of 1 micron, was formed by vacuum evaporation. A negative type photoresist (OMR-83) having a thickness of approximately 1 micron was applied on the metal film, and was exposed and developed to from a predetermined masking pattern. The obtained samples were etched to attain 50% overetching in the plasma etching apparatus used in the Experiment 1 under the following conditions, wherein the mixing ratio of each etchant gas was varied.

Figure 9A:
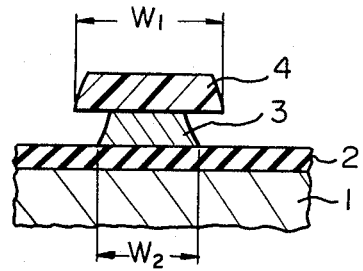
FIG. 9a is a schematic sectional view of a portion of an overetched sample.

Etchant gas:
$CCl_4+BCl_3$, $PCl_3+BCl_3$ or $CCl_3+He$
Total pressure of etchant gas:
200 milli-Torr
RF power:
1 KW A portion of one of the overetched samples is illustrated in the sectional view of FIG. 9a. In FIG. 9a, a silicon dioxide film 2 is on top of a silicon wafer 1, an etched metal film 3 is on top of the silicon dioxide film 2 and a patterned photoresist 4 is on top of the metal film 3. An amount of overetching is defined as $W_1$ minus $W_2$, wherein $W_2$ is a width of a conductor line of the overetched metal film 3 and $W_1$ is a width of a line of the patterned photoresist 4.

Figure 9B:
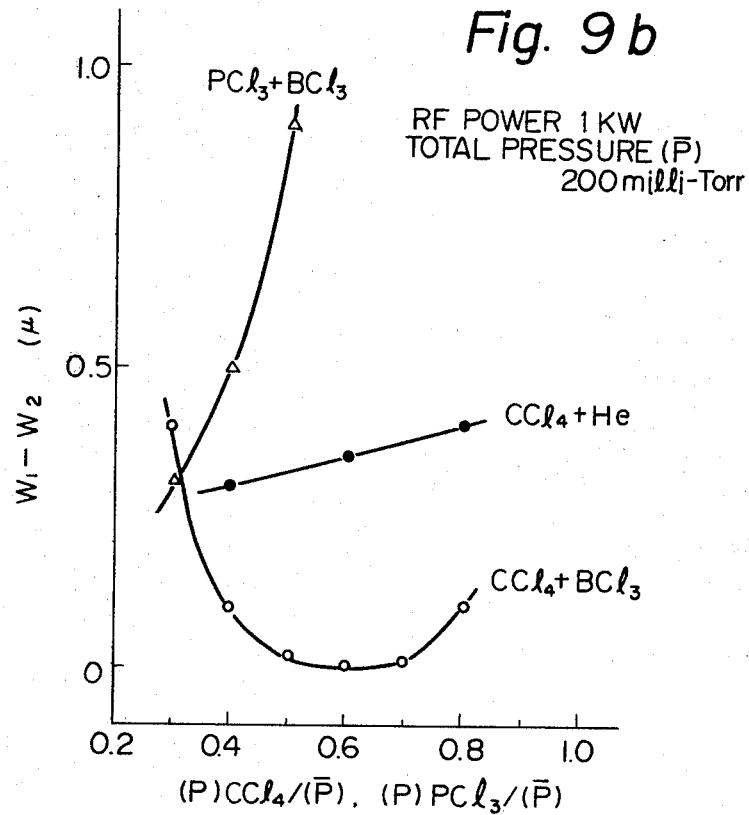
FIG. 9b is a diagram showing the relationship between the amount of undercutting of an aluminum film and the partial pressure ratio of $CCl_4$ or $PCl_3$ with regard to three kinds of etchant gases.
Figure 9C:
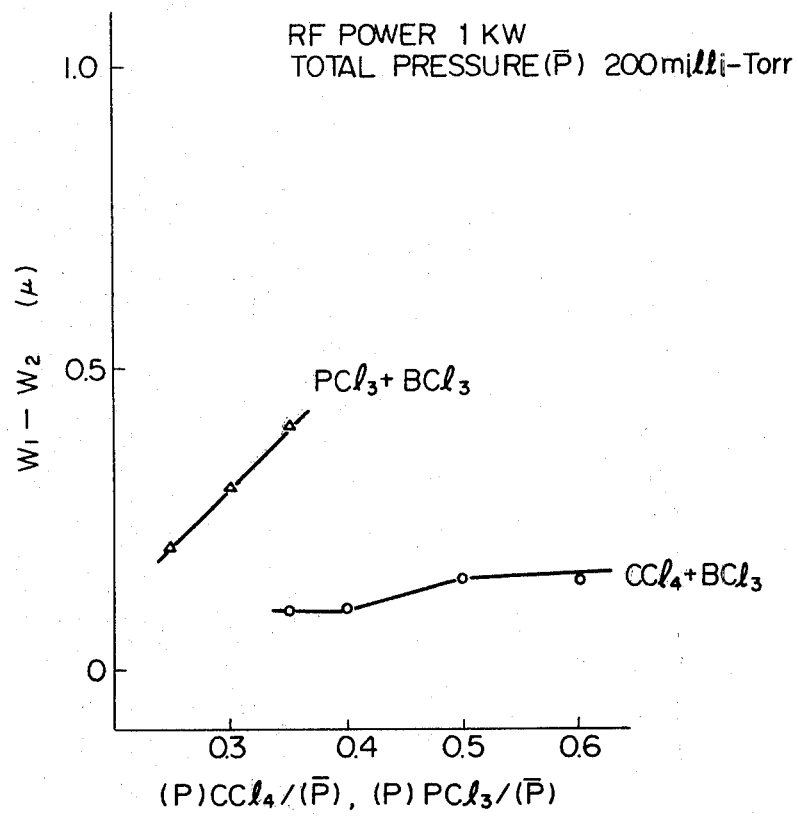
FIG. 9c is diagram showing the relationship between the amount of undercutting of an aluminum-copper film and the partial pressure ratio of $CCl_4$ or $PCl_3$ with regard to two kinds of etchant gases.

The results of the Experiment 9, wherein aluminum was used as the metal film material, are shown in FIG. 9b, and the results of the Experiment 9 wherein aluminum-copper was used as the metal film material are shown in FIG. 9c. As is evident from FIGS. 9b and 9c, the amount of overetching obtained by using the etchant gas of $CCl_4$ and $BCl_3$ is smaller than that obtained by using either the etchant gas $PCl_3$ and $BCl_3$ or the etchant gas of $CCl_4$ and He.

As is obvious from the Experiments 1 through 9, in order to dry etch aluminum and aluminum based metal, the use of the mixed gas of $CCl_4$ and $BCl_3$ as an etchant gas is preferable to the use of the mixed gas of $PCl_3$ and $BCl_3$ and the mixed gas of $CCl_4$ and He.

In the above-mentioned Experiments 1 through 9, the gases of $CCl_4$ and $BCl_3$ for the etchant gas of the present invention were introduced into a reaction chamber of the etching apparatus without a carrier gas. However, it is possible to use an inert gas (Ar or He) as the carrier gas for introduction of $CCl_4$ and $BCl_3$ into the reaction chamber. Also, it is possible to substitute the inert gas for less than one-half of the amount of $BCl_3$ used, without decrease of etching ability of the mixed gas of $CCl_4$ and $BCl_3$.

When a conductor pattern of a semiconductor device is formed by dry etching an aluminum film on a substrate in the production of a semiconductor device, although the mixed gas of $CCl_4$ and $BCl_3$ is used as an etchant gas in accordance with the present invention, undercutting inevitably occurs. In a case where overetching is performed, undercutting increases. In order to prevent undercutting from occurring or to minimize undercutting, it is preferable to form an aluminum oxide ($AlO_x$) film on the surface of the aluminum film by a treatment in water after at least one-half of the aluminum film etching in the course of the dry etching.

Figure 10A:
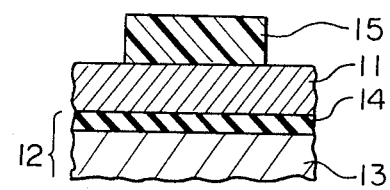
FIG. 10a through 10d are schematic sectional views of a portion of a semiconductor device in various stages of production in accordance with an embodiment of the present invention; and, FIG. 11a through 11d are schematic sectional views of a portion of a semiconductor device in various stages of production in accordance with another embodiment of the present invention.
Figure 10B:
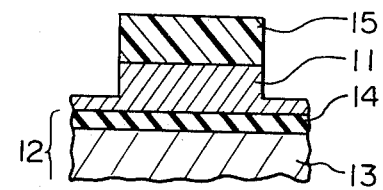

Referring now to FIGS. 10a through 10d, the process of dry etching an aluminum film on a semiconductor chip is explained. In this process, an aluminum film 11 is formed by vacuum evaporation or any other suitable technique on the surface of a semiconductor chip 12. The semiconductor chip 12 comprises a semiconductor substrate 13, e.g. a silicon single crystalline wafer, and an insulating film 14, e.g. a silicon dioxide film, which covers the surface of the substrate 13. A photoresist masking film 15 is applied on the surface of the aluminum film 11, and is exposed and developed to form a predetermined pattern, as illustrated in FIG. 10a. The aluminum film 11 on the semiconductor chip 12 is selectively etched in a dry etching apparatus, e.g. a plasma etching apparatus or a reactive ion etching apparatus (which have similar construction), using the mixed gas $CCl_4$ and $BCl_3$ as the etchant gas, to remove one-half to three-fourths of the unmasked portion of the aluminum film 11, as illustrated in FIG. 10b. It is preferable that the etchant gas consist of $CCl_4$ and $BCl_3$, but it is possible to add an inert gas, i.e. Ar or He, to the mixed gas of $CCl_4$ and $BCl_3$. A preferred partial pressure of the inert gas is less than 60 percent of the total pressure.

Figure 10C:
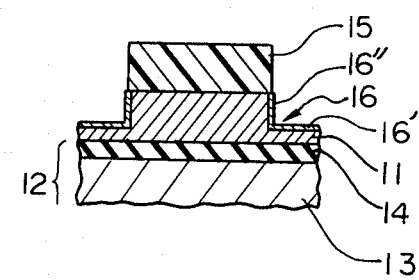

The semiconductor chip 12 is then taken out of the etching apparatus, and is treated with water, namely, is washed with water or is placed in a boiling water bath, to form an aluminum oxide film 16 comprising $Al_2O_3$ on the exposed surface of the aluminum film 11, as illustrated in FIG. 10c. A preferred thickness of the aluminum oxide film 16 is in the range of 100 to 1000 angstroms.

Figure 10D:
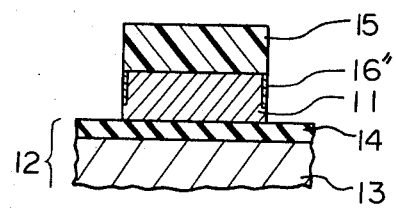

The aluminum film 11 with the aluminum oxide film 16 is reetched in the same etching apparatus by using the mixed gas of $CCl_4$ and $BCl_3$. In the reetching step, the etchrate of a horizontal portion 16' of the aluminum oxide film 16 is higher than that of a vertical portion 16" thereof, since a generated chemical sputtering effect on the horizontal portion 16' is stronger than that on the vertical portion 16". Furthermore, since the aluminum etchrate is higher than the aluminum oxide etchrate, the portion of aluminum film which is not covered with the photoresist 15 is removed, as illustrated in FIG. 10d. Accordingly, it is possible to obtain a conductor pattern of aluminum without undercutting or with very small undercutting.

In a case where an aluminum-copper film or an aluminum-silicon film, instead of the aluminum film, is dry etched to form a conductor pattern of a semiconductor device, copper or silicon residues accumlate as the dry etching proceeds. The accumlated residues prevent the etching from proceeding further and, as the result, the required etching period lengthens and the undercutting increases. In order to prevent the etching period from lengthening and to minimize the undersired undercutting, it is preferable to remove the copper or silicon residues by a suitable remover, and then, to form a thin aluminum oxide film on the exposed surface of the aluminum-copper film or aluminum-silicon film in the course of the dry etching.

Figure 11A:
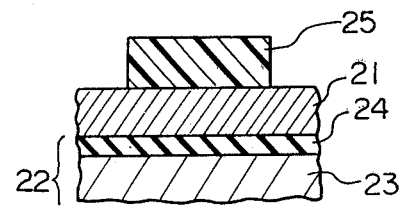
Figure 11B:
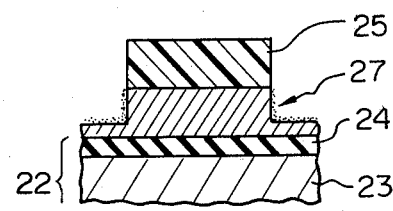

Referring to FIG. 11a through 11d, the process of dry etching an aluminum-copper or aluminum-silicon film on a semiconductor chip will now be explained. In this process, an aluminum base film 21 of either aluminum-copper or aluminum-silicon is formed on the surface of a semiconductor chip 22 by vacuum evaporation or any other suitable technique. The semiconductor chip 22 comprises a semiconductor substrate 23 and an insulating film 24, which are the same as the semiconductor substrate 13 and the insulating film 14 of FIG. 10, respectively. A photoresist masking film 25 is applied on the surface of the aluminum based metal 21, and is exposed and developed to form a pattern, as illustrated in FIG. 11a. The aluminum based film 21 is selectively etched in a plasma etching apparatus or a reactive ion etching apparatus, using the mixed gas of $CCl_4$ and $BCl_3$, to remove one-half to three-fourths of the unmasked portion of the aluminum film 21, as illustrated in FIG. 11b. After this etching, copper or silicon residues 27 remain on the etched aluminum based metal 21.

Figure 11C:
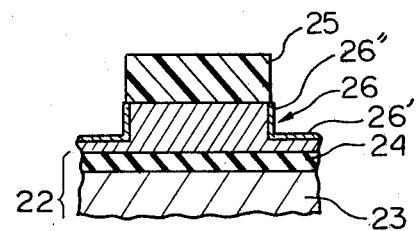

The semiconductor chip 22 is taken from the etching apparatus, and then the copper or silicon residues 27 are removed by nitric acid ($HNO_3$) solution or carbon tetrafluoride and oxygen ($CF_4+5\%O_2$) plasma which is generated under a condition such as 0.5 Torr, 500 watts, for 1 minute. Thereafter, the exposed surface of the aluminum based film 21 is washed with water. Such treatment in water forms an aluminum oxide ($AlO_x$) film 26 on the exposed surface of the aluminum based film 21, as illustrated in FIG. 11c. A preferred thickness of the aluminum oxide film 26 is in the range of from 100 to 300 angstroms.

Figure 11D:
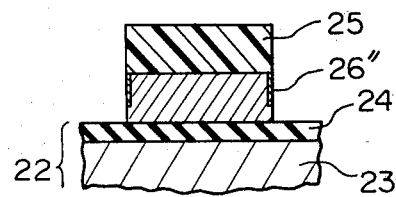

The aluminum based film 21 with the aluminum oxide film 26 consisting of a horizontal portion 26' and a vertical portion 26" is reetched in the same etching apparatus by using the mixed gas of $CCl_4$ and $BCl_3$. Since the reetching preceeds in the same manner as the above-mentioned reetching of the aluminum film, the portion of aluminum based film 21 which is not covered with the photoresist 25 is removed, as shown in FIG. 11d. Accordingly, it is possible to obtain a conductor pattern of aluminum-copper or aluminum-silicon without undercutting or with very small undercutting.

What is claimed is:

1. A process for dry etching of metal film having aluminum as a main component, comprising the step of exposing said metal film to an etchant gas consisting essentially of carbon chloride and boron chloride.

2. A process as claimed in claim 1, wherein said step of exposing said metal film uses an etchant gas consisting essentially of carbon tetrachloride and boron trichloride, the partial pressure of said carbon tetrachloride being in the range of from 30 to 80 percent of the total pressure of said etchant gas.

3. A process as claimed in claim 2, wherein said partial pressure of said carbon tetrachloride is in the range of from 40 to 70 percent of the total pressure of said mixed gas.

4. A process as claimed in claim 2, wherein said etchant gas has a pressure in the range of from 100 to 250 milli-Torr.

5. A process as claimed in claim 2, wherein said exposing step is performed by exciting said etchant gas at an RF power in the range of from 400 to 1000 watts.

6. A process as claimed in claim 2, wherein the material from which said metal film is made is selected from the group consisting of aluminum and aluminum base metal.

7. A process for dry etching of metal film having aluminum as a main component, comprising the steps of:
exposing said metal film to an etchant gas consisting essentially of carbon chloride and boron chloride, and
forming an aluminum oxide film on said metal film by a treatment in water at an intermediate stage of completion of said exposing step.

8. A process as claimed in claim 7, comprising the steps of:
forming a patterned masking film on said metal film;
exposing said metal film with said masking film to said etchant gas to remove the unmasked portion of said metal film to a depth of at least one-half of the thickness thereof, there remaining an unmasked, exposed horizontal portion of said metal film and a masked portion, the latter joining said unmasked and exposed horizontal portion by a vertical portion of said metal film;
forming said aluminum oxide film on the exposed surface of said metal film by a treatment in water; and
repeating said exposing step in said etchant gas to remove said aluminum oxide film from the horizontal portion of said metal film and the remainder of said unmasked, horizontal portion of said metal film.

9. A process as claimed in claim 7, further comprising the step of removing accumulated residues of said metal film of aluminum based metal by a remover, prior to said step of forming said aluminum oxide film.

10. A process as claimed in claim 9, comprising the steps of:
forming a patterned masking film on said metal film of aluminum based metal;
exposing said metal film with said masking film to said etchant gas to remove the unmasked portion of said metal film to a depth of at least one-half of the thickness thereof, there remaining an unmasked, exposed horizontal portion of said metal film and a masked portion, the latter joining said unmasked and exposed horizontal portion by a vertical portion of said metal film, and thereby causing said residues to accumulate;
removing said accumulated residues by said remover;
forming said aluminum oxide film on the exposed surface of said metal film by a treatment in water, and;
repeating the exposing step to remove said aluminum oxide film from the horizontal portion of said metal film and the remainder of said unmasked, horizontal portion of said metal film.

11. The process of claim 9 or 10 wherein said remover consists essentially of nitric acid ($HNO_3$) solution.

12. The process of claim 9 or 10, wherein said remover consists essentially of a plasma generated from carbon tetrafluoride and oxygen.

* * * * *

UNITED STATES PATENT AND TRADEMARK OFFICE
CERTIFICATE OF CORRECTION

PATENT NO. : 4,350,563
DATED : September 21, 1982
INVENTOR(S) : Tadakazu Takada et al.

It is certified that error appears in the above-identified patent and that said Letters Patent is hereby corrected as shown below:

Title page, second column, after "Primary Examiner - William A. Powell" insert --Attorney, Agent, or Firm - Staas & Halsey--;

Col. 3, line 53, delete line in its entirety;

Col. 6, line 7, "$BCl_3$" (first occurrence) should be --$PCl_3$--;

line 60, after "B'" insert --,--;

Col. 9, line 1, "base" should be --based--;

Signed and Sealed this

Twenty-first Day of June 1983

[SEAL]

Attest:

DONALD J. QUIGG

Attesting Officer

Acting Commissioner of Patents and Trademarks